(12) United States Patent
Martin et al.

(10) Patent No.: US 6,518,800 B2
(45) Date of Patent: Feb. 11, 2003

(54) SYSTEM AND METHOD FOR REDUCING TIMING MISMATCH IN SAMPLE AND HOLD CIRCUITS USING THE CLOCK

(75) Inventors: David A. Martin, Atlantic Highlands, NJ (US); Mark C. Spaeth, Cambridge, MA (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/866,273

(22) Filed: May 25, 2001

(65) Prior Publication Data

US 2001/0048729 A1 Dec. 6, 2001

Related U.S. Application Data
(60) Provisional application No. 60/208,406, filed on May 31, 2000.

(51) Int. Cl.$^7$ .............................................. H03K 17/00
(52) U.S. Cl. ........................ 327/94; 327/393; 327/337
(58) Field of Search ........................ 327/94, 91, 152, 327/153, 154, 155, 161, 393, 396, 401, 337; 347/122

(56) References Cited

U.S. PATENT DOCUMENTS

| | | | | |
|---|---|---|---|---|
| 4,632,001 A | * | 12/1986 | Suzuki | 84/603 |
| 4,811,342 A | * | 3/1989 | Huang | 370/292 |
| 4,962,380 A | | 10/1990 | Meadows | 347/120 |
| 4,977,446 A | * | 12/1990 | Shiomi et al. | 358/60 |
| 5,017,924 A | * | 5/1991 | Guiberteau et al. | 342/195 |
| 5,184,127 A | * | 2/1993 | Myers | 341/122 |
| 5,376,841 A | * | 12/1994 | Itakura et al. | 327/94 |
| 5,414,329 A | * | 5/1995 | George | 315/368.23 |
| 5,416,432 A | * | 5/1995 | Lewis et al. | 327/60 |
| 5,521,599 A | * | 5/1996 | McCarroll et al. | 341/122 |
| 5,682,175 A | * | 10/1997 | Kitamura | 345/98 |
| 5,724,363 A | * | 3/1998 | Breya | 371/5.5 |
| 5,744,985 A | * | 4/1998 | Nishida | 327/94 |
| 6,407,687 B2 | * | 6/2002 | Martin et al. | 341/122 |

FOREIGN PATENT DOCUMENTS

| | | |
|---|---|---|
| EP | 0 298 618 A2 | 1/1989 |
| EP | 0 875 764 A2 | 11/1998 |
| JP | 404298898 A | * 10/1992 |

OTHER PUBLICATIONS

Nagaraj, Krishnaswamy, et al., "A Dual–Mode 700–Msamples/s 6–bit 200–Msamples/s 7–bit A/D Converter in a 0.25μm Digital CMOS Process," IEEE Journal of Solid–State Circuits, vol. 35, No. 12, Dec. 2000, pp. 1760–1768.

Nagaraj, K., et al., "A 700M Sample/s 6b Read Channel A/D Converter with 7b Servo Mode," 2000 IEEE International Solid–State Circuits Conference, Session 26, Analog Techniques, Paper WP 26.1, pp. 426–427.

* cited by examiner

Primary Examiner—Timothy P. Callahan
Assistant Examiner—Hai L. Nguyen
(74) Attorney, Agent, or Firm—J. Dennis Moore; W. James Brady, III; Frederick J. Telecky, Jr.

(57) ABSTRACT

The present invention relates to a high speed sample and hold circuit which comprises a plurality of sample and hold subcircuits coupled in parallel between an input and an output. The circuit also comprises a calibration circuit coupled to the plurality of sample and hold subcircuits. The calibration circuit is operable to establish a timing relationship between a hold signal and a clock signal for each of the plurality of sample and hold subcircuits which is generally the same. The established timing relationship reduces a timing mismatch between the plurality of sample and hold subcircuits and distortion associated therewith. The present invention also comprises a method of reducing timing mismatch in a high speed, parallel coupled sample and hold circuit. The method comprises synchronizing a hold signal to a clock signal by modifying the hold signal for each of a plurality of sample and hold subcircuits within the sample and hold circuit and utilizing the modified hold signals in the sample and hold subcircuits, respectively.

15 Claims, 5 Drawing Sheets

SYSTEM AND METHOD FOR REDUCING TIMING MISMATCH IN SAMPLE AND HOLD CIRCUITS USING THE CLOCK

This application claims priority under 35 USC § 119(e)(1) of provisional application Ser. No. 60/208,406, filed May 31, 2000.

TECHNICAL FIELD

The present invention relates generally to electrical circuits, and more particularly to a system and method for reducing timing mismatch in sample and hold circuits.

BACKGROUND OF THE INVENTION

Figure 1:
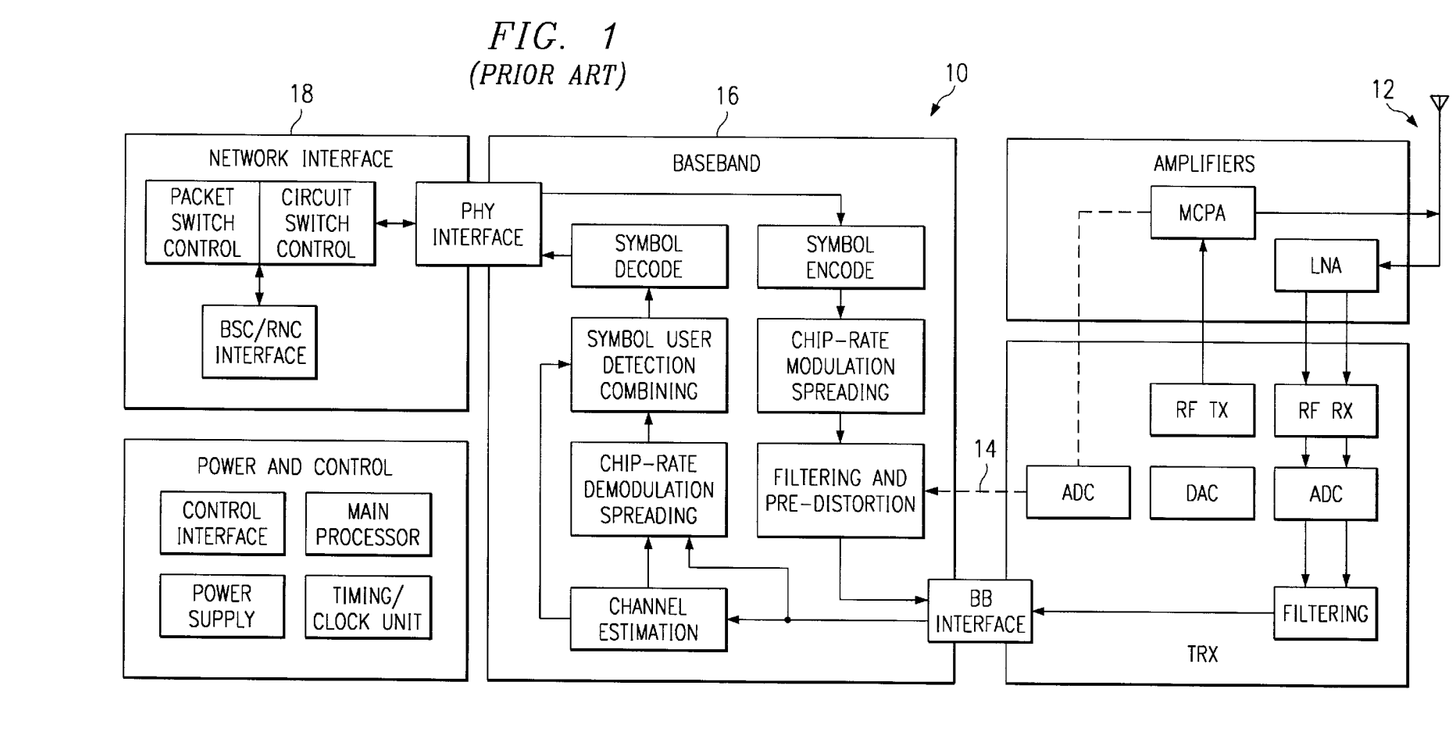
FIG. 1 is a block system level diagram illustrating a prior art base transceiver station utilizing a plurality of ADCs.
Figure 2:
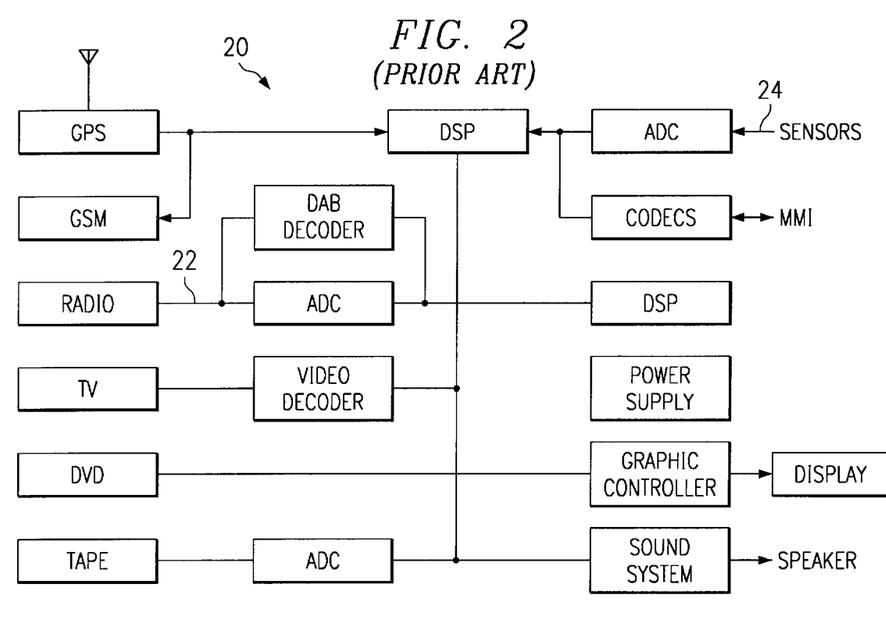
FIG. 2 is a block system level diagram illustrating a prior art multimedia controller for an automobile employing a plurality of ADCs.

Analog to digital converters (ADCs) are important analog circuit devices which take an analog input signal and generate one or more digital signals which are representative of the analog input. ADCs are used in many applications such as communications applications in which the components receive a voice input (an analog input) and transform the voice date into a digital format for internal processing. Exemplary applications using such ADCs are illustrated in prior art FIGS. 1 and 2, respectively. For example, in prior art FIG. 1, an exemplary base transceiver station (BTS) 10 is illustrated in which an RF analog input signal 12 is received, amplified and converted into a digital signal 14 before being processed in a baseband section 16 and network interface section 18. Similarly, prior art FIG. 2 illustrates a schematic diagram of an automobile multimedia system 20 in which various analog signals such as radio signals 22 and sensor signals 24 are transformed into digital signals for subsequent processing. Further, many other system applications exist, including, but not limited to, hard disk drive (HDD) read channel applications.

One of the most challenging portions of an ADC is the sample and hold (S/H) circuit at the front end thereof. As the speed of ADCs continues to grow, the design of the S/H circuit becomes more challenging, and various solutions have been proposed to improve the speed of such S/H circuits. One prior art circuit solution for improving the speed of a S/H circuit is illustrated in prior art FIG. 3 and designated at reference numeral 30. The S/H circuit 30 consists of four S/H subcircuits 32a–32d coupled together in parallel. Each of the S/H subcircuits 32a–32d operates individually as a S/H circuit, wherein the input $V_{IN}$ is passed to the output $V_{OUT}$ during a "sampling mode" and the state of the input is maintained on the output in the "hold mode", respectively.

Figure 3:
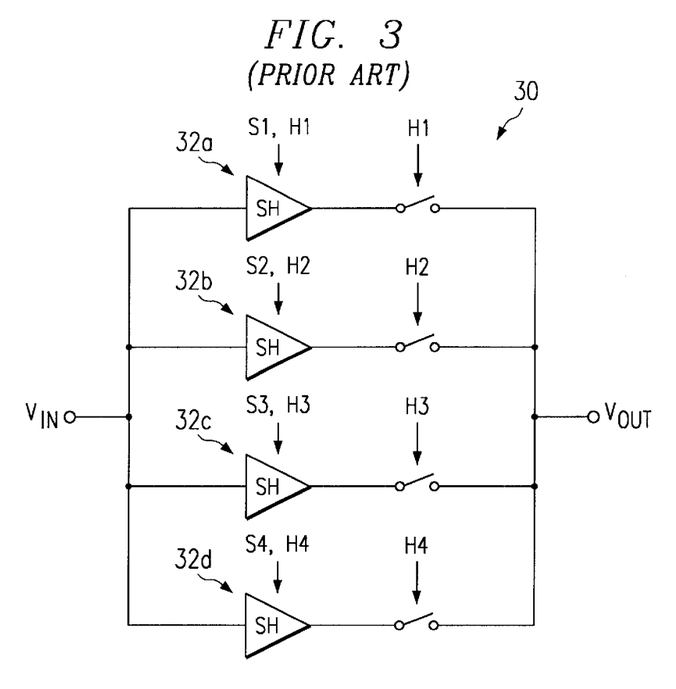
FIG. 3 is a simplified schematic diagram illustrating a prior art high speed sample and hold (S/H) circuit having four S/H subcircuits coupled together in parallel.
Figure 4:
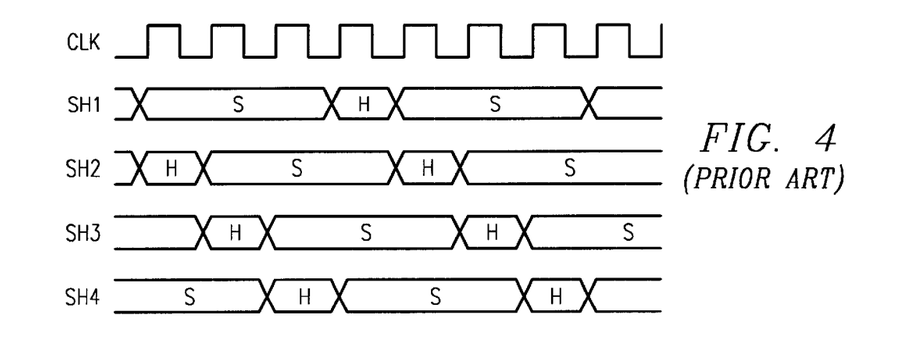
FIG. 4 is a timing diagram illustrating an exemplary timing operation for the four S/H subcircuits of prior art FIG. 3.

The speed of the S/H circuit 30 of FIG. 3 is increased by using several individual S/H subcircuits interleaved in time. An exemplary sample timing diagram for the S/H circuit 30 is illustrated in prior art FIG. 4. Note that with multiple S/H subcircuits interleaved in time, each subcircuit transitions through one sample and hold cycle in four clock (CLK) cycles, whereas if a similar speed were desired with only a single S/H subcircuit, the sample and hold functions each would have to be completed within a one-half (1/2) clock cycle. Therefore in the above parallel configuration, the overall speed is increased without requiring higher performance from the individual S/H subcircuit elements.

Referring again to prior art FIG. 3, although the pass gates at the output of the overall S/H circuit 30 might seem like a possible speed limitation, usually such S/H circuits are followed by one or more output buffers. In such a case, the RC filter of the pass gate and the input capacitance of the output buffer is usually fairly small compared with the speed gained through parallelism.

One problem with the technique provided by the circuit 30 of prior art FIG. 3 is that if the S/H subcircuits 32a–32d are not perfectly matched, then errors can occur. The three chief types of mismatch associated with the S/H circuit 30 are offset mismatch, gain mismatch and timing mismatch. A brief discussion of the operation of an individual conventional S/H subcircuit is provided below in order to appreciate the impact that timing mismatch has on the performance of the S/H circuits 30.

Figure 5:
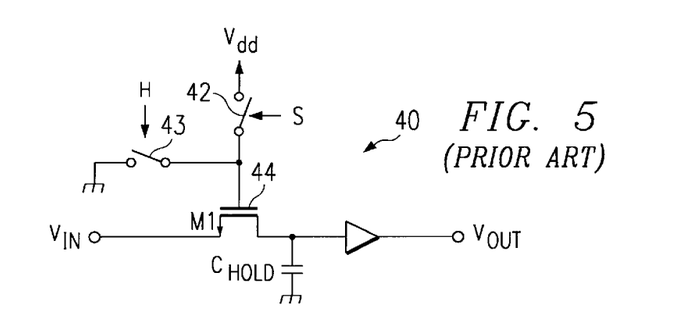
FIG. 5 is a schematic diagram illustrating an exemplary prior art S/H subcircuit used in prior art FIG. 3 used to help illustrate the problem associated with timing mismatch in prior art high speed S/H circuits.

An exemplary prior art sample and hold subcircuit is illustrated in prior art FIG. 5, and designated at reference numeral 40. Circuit 40 is a detailed circuit of structure 32a in FIG. 3. Transistor M1 operates as a sampling switch, and $C_{HOLD}$ acts as a sampling capacitor. In the sampling mode, a sampling signal "S" is asserted, thereby closing a switch 42, which activates M1 (turns M1 on). With M1 on, $V_{IN}$ is passed to the output $V_{OUT}$.

A significant time point relating to timing mismatch in S/H circuits deals with the instant when the sampling switch M1 is deactivated, or turned off. Any deviation of the deactivation of M1 from perfect CLK/N time periods will cause a timing mismatch between the various subcircuits and result in distortion at the output $V_{OUT}$. To deactivate M1, the sample signal "AS" goes low and a hold signal "H" is asserted, which causes a switch 43 to close. This instance pulls the gate of M1 down to ground, thus turning M1 off. Each S/H subcircuit has its own hold signal "H"; consequently, a primary source of the timing mismatch relates to mismatches in the switch M1 driven by "H" and the arrival of the hold signal "H" at each subcircuit switch, respectively. In addition, even if no timing mismatch occurs between "H" signals of various subcircuits 32a–32d, a sizing mismatch of switch 43 or M1 between various subcircuits may exist which may contribute disadvantageously to timing mismatch.

There is a need in the art for a circuit and method for increasing the speed in sample and hold circuits in which timing mismatch is reduced substantially.

SUMMARY OF THE INVENTION

According to the present invention, a system and method of reducing timing mismatch in high speed S/H circuits is disclosed.

According to the present invention, timing mismatch related to the sampling switch in various S/H subcircuits is reduced by calibrating the subcircuits so that the hold signal of the subcircuits are synchronized with respect to the CLK signal, for example, by "catching" the CLK signal at the analog input for each subcircuit on its edge using the hold signal. In the above manner, a predetermined timing relationship between the clock signal and the hold signal is established for each S/H subcircuit. In the above manner, the timing mismatch between the various S/H subcircuits associated with the arrival of the hold signal at its switch in each subcircuit is reduced substantially or eliminated altogether.

According to one aspect of the present invention, subcircuits within a parallel S/H circuit are calibrated so as to reduce timing mismatch by feeding the CLK into the analog input of a S/H subcircuit input and analyzing the subcircuit output. Calibration occurs by modifying the hold signal such that a predetermined timing relationship is established between the CLK signal and the hold signal for each subcircuit, respectively.

According to another aspect of the present invention, a high speed S/H circuit comprises a plurality of S/H subcircuits coupled together in parallel and a calibration circuit associated therewith. The calibration circuit is operable to establish a predetermined timing relationship between a hold signal and the CLK signal for each of the S/H subcircuits. In an exemplary illustration of the present invention, the calibration circuit is selectively employable, and operates to feed the clock signal into each S/H subcircuit input and analyze each S/H subcircuit output with respect to the timing relationship between the hold signal and the CLK signal. Based on the various S/H subcircuit outputs, the hold ("H") signal for each S/H subcircuit is modified, for example, delayed, in order to establish the desired timing relationship.

According to still another aspect of the present invention, a method for reducing timing mismatch in a S/H circuit is provided. The method comprises synchronizing a hold signal to a CLK signal by modifying the hold signal for each of a plurality of S/H subcircuits. The modified hold signals are then employed within the respective S/H subcircuits to thereby reduce the timing mismatch therebetween, thus reducing output distortion. In an exemplary illustration of the present invention, the synchronization of the CLK signal and the hold signal with a S/H subcircuit comprises inputting the CLK signal into an input of the S/H subcircuit. The S/H output is then used to determine a status of the CLK signal with respect to the hold signal. The status is then used to modify the hold signal for the subcircuits independently of one another, thereby altering a timing relationship between the CLK signal and the hold signal for the respective S/H subcircuits.

To the accomplishment of the foregoing and related ends, the invention comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed and the present invention is intended to include all such embodiments and their equivalents. Other objects, advantages and novel features of the invention will become apparent from the following detailed description of the invention when considered in conjunction with the drawings.

DETAILED DESCRIPTION OF THE INVENTION

The present invention will now be described with respect to the accompanying drawings in which like numbered elements represent like parts. The present invention is directed to a system and method for reducing timing mismatch in high speed S/H circuits. In S/H circuits employing a plurality of parallel coupled S/H subcircuits, timing mismatch is reduced by calibration of the hold signal with respect to the CLK signal to thereby established a predetermined timing relationship therebetween for each of the S/H subcircuits individually. According to one exemplary aspect of the present invention, the calibration is accomplished by inputting the CLK signal into each of the S/H subcircuits and analyzing each subcircuit output. The state of the S/H subcircuit output is then utilized to modify the hold signal for each S/H subcircuit.

Figure 6:
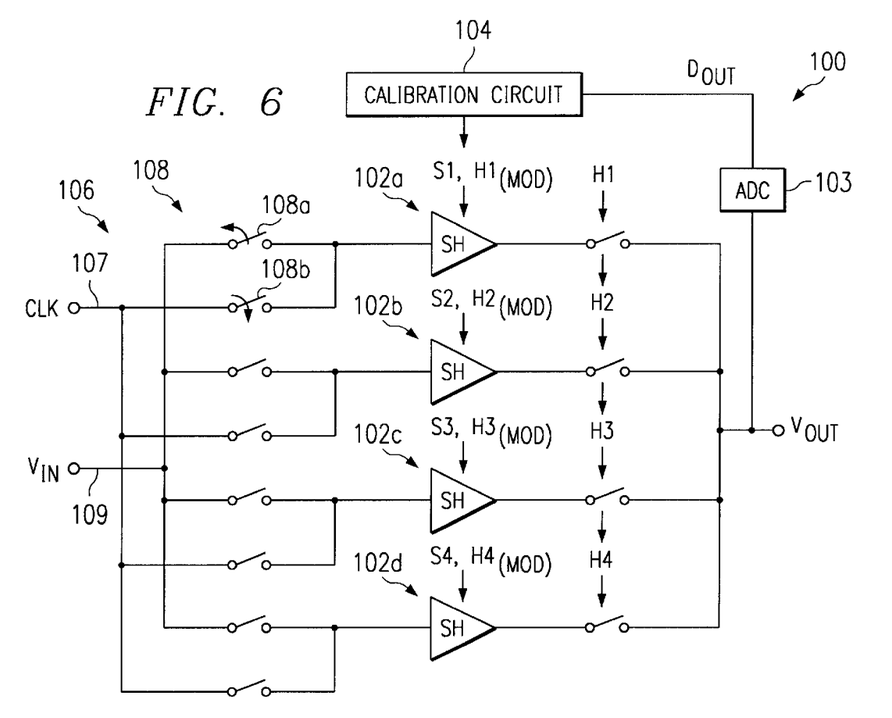
FIG. 6 is a schematic diagram illustrating a circuit for eliminating or reducing substantially timing mismatch in a high speed S/H circuit according to the present invention.

Turning now to the figures, FIG. 6 is a schematic diagram illustrating a system or circuit for reducing timing mismatch in a high speed, parallel coupled S/H circuit, and is designated at reference numeral 100. The S/H circuit 100 includes a plurality of S/H subcircuits 102a–102d (e.g., four (4) subcircuits), which are coupled together in parallel between an input portion (which includes an analog input terminal $V_{IN}$) and an output terminal $V_{OUT}$. The S/H circuit 100 also includes an ADC 103 and a calibration circuit 104 associated with the S/H subcircuits 102a–102d, for example, coupled between the output $V_{OUT}$ and the input portion of the circuit 104, respectively. The calibration circuit 104 is operable to calibrate the various S/H subcircuits 102a–102d by establishing a predetermined timing relationship between the hold signal and the CLK signal for the various S/H subcircuits, respectively. The calibration which results in the timing relationship between the signals reduces the mismatch in the switches of the various S/H subcircuits 102a–102d which is driven by the hold signal and thus reduces timing mismatch between the S/H subcircuits 102a–102d and reduces distortion at the output $V_{OUT}$. The manner in which such functionality is effectuated will be described in greater detail below. The signal CLK, signal 107, is the main system clock for the entire system.

According to one aspect of the present invention, the system clock CLK is selectively coupled to an input portion 106 of the S/H circuit 100. For example, as illustrated in FIG. 6, the CLK is coupled to the input portion 106 through a switching arrangement 108. The switching arrangement 108 may be controlled by a control circuit (not shown) which operates to open a first switch 108a to decouple the analog input $V_{IN}$, signal 109, from the input portion 106 of the S/H circuit 102a, and close a second switch 108b which couples the S/H circuit 102a to the system clock CLK. Therefore the S/H circuits 102a–102d may be selectively employed using the switching arrangement 108 so as to be coupled in a calibration mode and be decoupled in a standard or conventional analog sampling mode, respectively.

In accordance with one aspect of the present invention, the CLK signal is fed into the input portion 106 of the S/H circuit 102a-102d, thus replacing the analog input $V_{IN}$ with CLK. The S/H circuit 100 then operates in a conventional manner with the output $V_{OUT}$ representing a status or state of the CLK signal based upon the timing relationship between the CLK signal and the hold signal ("H"). The calibration circuit 104 then analyzes the status and modifies the hold signal (e.g., "H" modified to $H_{(MOD)}$). The modified hold signal is then utilized to again sample the input (CLK) at the output, and the output $V_{OUT}$ is again reevaluated. This process continues using the calibration circuit until a timing relationship between the modified hold signal and the CLK signal is established (e.g., the timing relationship meets a predetermined criteria or $V_{OUT}$ falls within a predetermined range) for each of the S/H subcircuits 102a–102d individually. The modified hold-signal (e.g., a different $H_{(MOD)}$ for each of the S/H subcircuits 102a–102d) subsequently is utilized in the standard or conventional mode of operation to reduce the timing mismatch between the various S/H subcircuits 102a–102d, thereby reducing distortion associated therewith at the output $V_{OUT}$.

As discussed above, the calibration circuit 104 of FIG. 6 operates to modify the hold signal associated with the various S/H subcircuits 102a–102d individually so that the timing relationship between each modified hold signal and CLK will conform to the predetermined timing relationship. Consequently, the manner and/or extent to which the hold signal associated with each S/H subcircuit 102a–102d is modified may differ from one another. According to one exemplary aspect of the present invention, the hold signals for the various S/H subcircuits 102a–102d are modified by delaying the hold signal by a given amount. Alternatively, however, other ways of modifying the hold signal may be employed and such hold signal modifications are contemplated as falling within the scope of the present invention.

Figure 7:
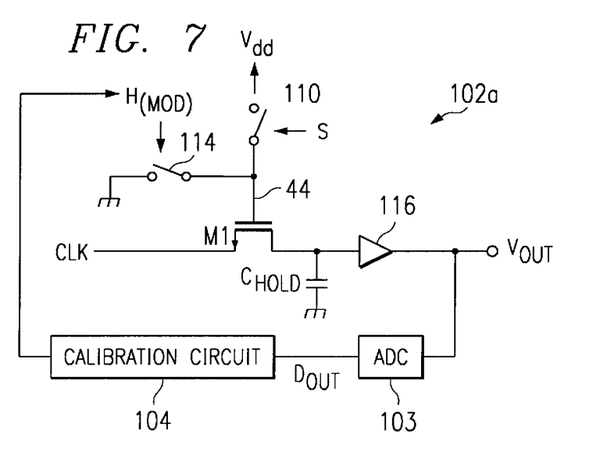
FIG. 7 is a combined block diagram and schematic diagram illustrating an exemplary subcircuit within the high speed S/H circuit of FIG. 6 according to the present invention.

An exemplary S/H subcircuit 102a having the calibration circuit 104 (or alternatively a calibration subcircuit if each subcircuit employs its own calibration circuit) associated therewith is illustrated in greater detail in FIG. 7. The S/H subcircuit 102a includes a sampling switch M1 and a holding capacitor $C_{HOLD}$. In addition, the subcircuit 102a includes switches 110 and 114, respectively, as shown. The S/H subcircuit 102a operates in conjunction with the calibration circuit 104 in the following exemplary manner. When the sampling signal "S" is asserted (goes high) the switch 110 is closed, thereby coupling $V_{dd}$ to the gate of M1 and turning M1 on. At the same time "S" is asserted, the hold signal "H" is low, causing the switch 114 to be open. When M1 is on, the input (which is the CLK signal is passed through M1, which is conducting, and a buffer 116 to the output $V_{OUT}$ and is fed back to the calibration circuit 104 through the ADC 103. Such S/H subcircuit operation constitutes the sampling mode.

When it becomes time to discontinue the sampling mode, the hold signal "H" goes high while the sampling signal "S" goes low, which closes the switch 114 and opens the other switch 110, respectively. The voltage state of the output $V_{OUT}$ is then held while M1 is off by the holding capacitor $C_{HOLD}$. Therefore during the above conditions, the S/H subcircuit 102a is in a "holding" mode of operation, wherein the state or status at the output is a function of the time at which the hold signal arrived at the switch 114 to close it.

As discussed previously in conjunction with prior art FIG. 3 and FIG. 7, there is a delay between a CLK edge and the sampling instant when a hold signal's ("H") rising edge closes switch 114, causing transistor M1 to turn off. Timing mismatch occurs between the S/H subcircuits 102a–102d (as shown in FIG. 6) when this delay is not exactly the same for all subcircuits. The present invention reduces or eliminates altogether such timing mismatch by establishing a predetermined timing relationship between the hold signal used to activate the switch 114 ($H_{(MOD)}$) and the CLK signal for each S/H subcircuit 102a–102d, thereby synchronizing the modified hold signal utilized to activate the switches 114.

Figure 8:
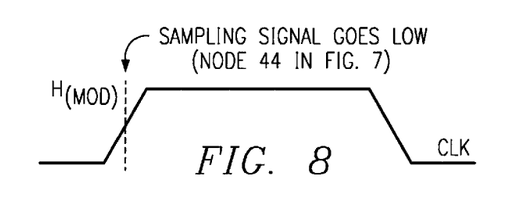
FIG. 8 is a modified clock waveform diagram illustrating an exemplary timing of a clock waveform with respect to a modified hold signal for use within the S/H subcircuit of FIG. 7 according to the present invention.

In the S/H subcircuit 102a of FIG. 7, the CLK signal is fed into the subcircuit input and its state is "held" based on the timing of the hold signal "H". Therefore by analyzing the output $V_{OUT}$ in a sample and hold cycle, the calibration circuit 104 identifies a present timing relationship between the signals and modifies the hold signal in response thereto so as to establish the desired predetermined timing relationship. According to one exemplary aspect of the present invention, the predetermined timing relationship is such that the modified hold signal catches the CLK signal on its edge, as illustrated in FIG. 8. In this case, the calibration circuit 104 will adjust $H_{(MOD)}$ so that $D_{OUT}$, the output of the ADC 103, is the ADC's midpoint value. Alternatively, however, other timing relationships between the signals may be established and are contemplated as falling within the scope of the present invention.

Figure 9:
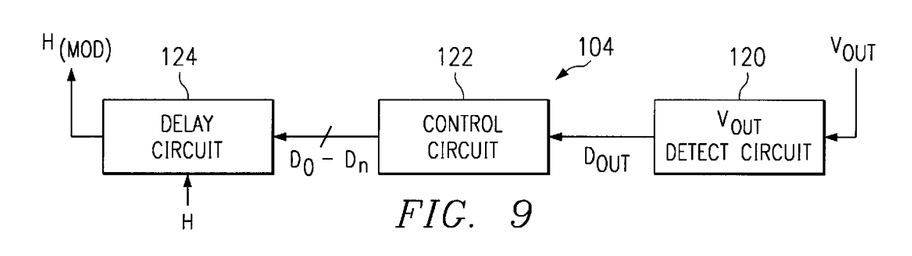
FIG. 9 is a block diagram illustrating an exemplary calibration circuit for modifying a hold signal for the S/H subcircuit of FIG. 7 according to the present invention.

According to one exemplary aspect of the present invention, the calibration circuit 104 modifies the hold signal by adding delay thereto. An exemplary, more detailed illustration of the calibration circuit 104 is illustrated in FIG. 9. In FIG. 9, the output of the S/H subcircuit $V_{OUT}$ is fed into a $V_{OUT}$ detect circuit 120 which determines what the status of $V_{OUT}$ is and communicates such status to a control circuit 122 which generates one or more control signals $D_0$–$D_n$ in response thereto. A delay circuit 124 receives the control signals $D_0$–$D_n$ and the hold signal and delays the hold signal by a specified amount as dictated by the control signals. In the above discussion, since $V_{OUT}$ is held by the holding capacitor $C_{HOLD}$, the $V_{OUT}$ detect circuit 120 may be simply an ADC which provides the $V_{OUT}$ status to the control circuit in a digital form $D_{OUT}$. Alternatively, the $V_{OUT}$ detect circuit 120 may be removed from the calibration circuit if the ADC 103 is implemented. In any event, the delay circuit 124 outputs a modified hold signal ($H_{(MOD)}$) which has been delayed with respect to the original hold signal. This modified hold signal is then fed back into the S/H subcircuit and utilized to activate the switch 114 as illustrated in FIG. 7 and the analysis is repeated until the control circuit 122 determines (using the status of $V_{OUT}$) that the predetermined timing relationship has been established.

Figure 10:
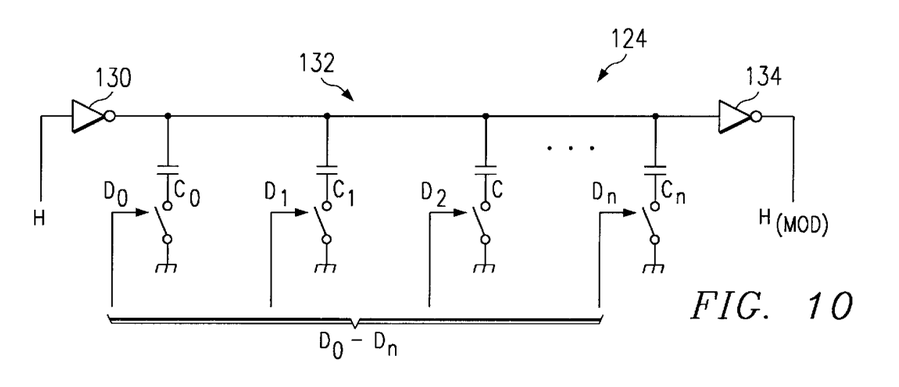
FIG. 10 is schematic diagram illustrating an exemplary delay circuit for modifying a hold signal for synchronizing the various S/H subcircuits within a high speed S/H circuit according to the present invention.

Various circuits may be employed to delay or otherwise modify the hold signal and any such circuit 124 is contemplated as falling within the scope of the present invention. One exemplary delay circuit 124 is illustrated in FIG. 10. The delay circuit 124 includes a first inverter 130 which takes the incoming hold signal and inverts the signal to $H_{(bar)}$. The output of the first inverter 130 has a plurality of selectively employable capacitive loading elements 132 which act to delay the inverted hold signal ($H_{(bar)}$) by various amounts depending upon the number of elements coupled thereto.

The capacitive loading elements 132 include a plurality of capacitors $C_0$–$C_n$ in series with switches $SW_0$–$SW_n$, respectively, which are controlled by the control signals $D_0$–$D_n$ from the control circuit 122. When a control signal activates a switch (e.g., switch $SW_0$), the associated capacitor $C_0$ is coupled to the output of the first inverter 130, thereby adding a delay to $H_{(bar)}$. As can be seen from FIG. 10, if all the switches are open, then the delay associated with H is negligible, whereas if the control signals $D_0$–$D_n$ dictate that all the switches are closed, a maximum hold signal delay will be effectuated. The delayed $H_{(bar)}$ signal is then re-inverted back as a modified hold signal ($H_{(MOD)}$) via a second inverter 134. As shown above, N capacitors of the same size provide for N different delays. Alternatively, if greater resolution is desired for modifying the hold signal, the capacitors may be sized differently from one another so as to provide different amounts of delay. For example, if the capacitor sizes are weighted in a binary fashion, $2^N$ different delays may be achieved, as may be desired.

Figure 11:
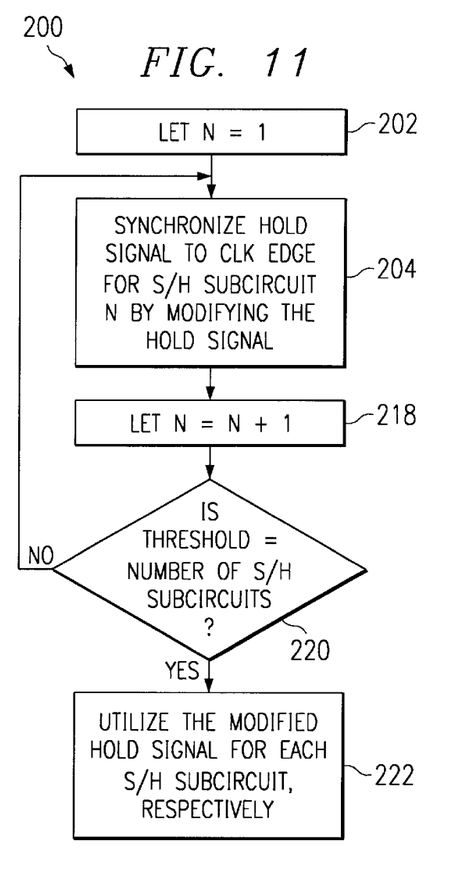
FIG. 11 is a flow chart diagram illustrating a method for reducing timing mismatch in a S/H circuit according to the present invention.

According to yet another aspect of the present invention, a method for reducing timing mismatch in S/H circuits is disclosed, as illustrated in FIG. 11 and designated at reference numeral 200. The method 200 primarily relates to reducing timing mismatch between various parallel coupled S/H subcircuits by synchronizing their hold signals with the CLK signal for each of the S/H subcircuits. The method 200 begins at step 202, wherein a initialization occurs; that is, a variable is initialized to one (N=1) which represents that the first S/H subcircuit will be synchronized. The method 200 progresses to step 204, wherein the synchronization of the CLK and the hold signal occurs and a predetermined timing relationship therebetween is established.

Figure 12:
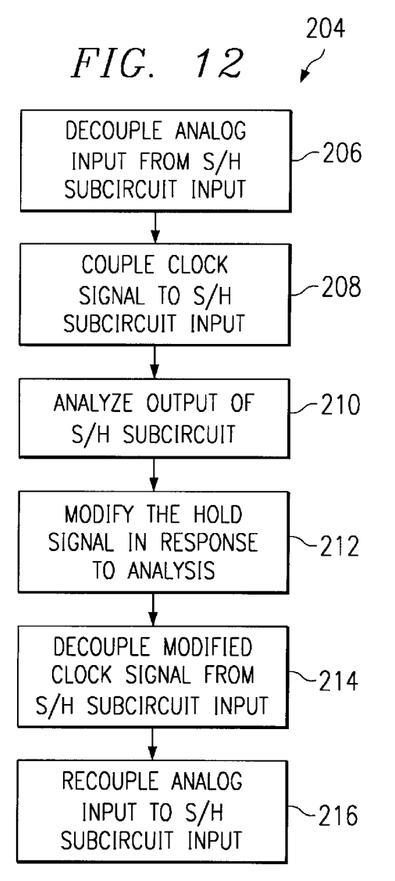
FIG. 12 is a flow chart diagram illustrating an exemplary method of synchronizing a hold signal with a CLK signal of a S/H subcircuit according to the present invention.

Various methods of performing the above synchronization may be employed and all such methods are contemplated as falling within the scope of the present invention. One exemplary manner of performing the synchronization is illustrated in FIG. 12. Initially, the analog input of the S/H subcircuit is decoupled therefrom at step 206 and the CLK signal is coupled to the S/H subcircuit input at step 208. The S/H subcircuit is then operated in a normal fashion and the output is analyzed at step 210 to identify the timing relationship that exists between the CLK signal and the hold signal. The analysis includes, for example, comparing the timing relationship to one or more predetermined ranges or criteria and if the timing relationship is either not within the range or does not satisfy the criteria, then the hold signal is modified at step 212.

Modifying the hold signal at step 212 may be done in any of a variety of ways and any modification is contemplated as falling within the scope of the present invention. For example,.the hold signal may be delayed. Steps 210 and 212 are then repeated until the hold signal and the sampling signal are sufficiently synchronized. The CLK signal is then decoupled from the S/H subcircuit input at step 214 and the analog input is re-coupled to the S/H subcircuit input at step 216.

Returning to FIG. 11, once the synchronization at step 204 is completed, the variable N is incremented at step 218 and an inquiry is then made at step 220 whether a threshold has been reached, meaning whether all the S/H subcircuits have been synchronized. For example, if the S/H circuit has four (4) S/H subcircuits coupled together in parallel, the threshold is five (5). If N reaches the threshold, all the S/H subcircuits have been synchronized. If the inquiry at step 220 is NO, the method 200 returns to step 204 and the next S/H subcircuit is synchronized. If the threshold is reached at step 220 (YES), then each of the S/H subcircuits are synchronized and the modified hold signals are then utilized in normal operation for each S/H subcircuit to reduce the timing mismatch therebetween.

Although the analog signal paths in the above description have been shown and described as single-ended, implementations which use differential analog signal paths may also be employed and are contemplated as falling within the scope of the present invention.

Although the technique described above is described as taking place when the circuit is first turned on, it can also be applied at regular or irregular intervals during the ADC's operation, depending upon the requirements of the system in which it is used. Such use is contemplated as falling within the scope of the present invention. Furthermore, although the technique described above is described as taking place during an ADC calibration period during which the ADC is not generating an output, it can also be performed in the background if an additional S/H subcircuit is available. Such operation is contemplated as falling within the scope of the present invention.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application. Furthermore, to the extent that the term "includes" is used in either the detailed description and the claims, such term is intended to be inclusive in a manner similar to the term "comprising."

What is claimed is:

1. A high speed sample and hold circuit usable in a system having a clock signal, comprising:
   a plurality of sample and hold subcircuits coupled in parallel between an input and an output, each such sample and hold subcircuit operable to sample the clock signal during a sample cycle of a sample signal and hold the sampled input signal during a hold cycle of a hold signal, the sample cycles and hold cycles alternating with one another; and
   a calibration circuit coupled to the plurality of sample and hold subcircuits, wherein the calibration circuit establishes a timing relationship between the hold signal and the clock signal for each of the plurality of sample and hold subcircuits which is generally the same, respectively, thereby reducing a timing mismatch between the plurality of sample and hold subcircuits and distortion associated therewith, wherein the calibration circuit comprises:
      a sample and hold subcircuit output detection circuit;
      a control circuit coupled to the detection circuit; and
      a modification circuit coupled to the control circuit,
      wherein the detection circuit is operable to detect a status of an output of a sample and hold subcircuit, and wherein the control circuit is operable to generate one or more control signals in response to the detected status, and wherein the modification circuit is operable to modify the timing relationship between the hold signal and the clock signal in response to the one or more control signals.

2. The sample and hold circuit of claim 1, wherein the modification circuit comprises a hold signal delay circuit which is operable to delay the hold signal with respect to the clock signal in response to the one or more control signals.

3. The sample and hold circuit of claim 2, wherein the hold signal delay circuit comprises a multi-delay circuit having a hold signal input and a hold signal output, wherein a delay between the input and the output is a function of the one or more control signals.

4. The sample and hold circuit of claim 3, wherein the multi-delay circuit comprises:
   a first inverter circuit coupled to the hold signal input, wherein an output of the first inverter circuit comprises an inverted hold signal;
   one or more selectively coupled delay elements coupled to the output of the first inverter, and wherein a number of the delay elements which are coupled to the first inverter circuit output is a function of the one or more control signals; and
   a second inverter circuit having an input coupled to the one or more selectively coupled delay elements, and further comprising an output, wherein the output of the second inverter circuit comprises an inversion of the inverted hold signal having a delay associated therewith, and wherein the delay is a function of the number of delay elements coupled thereto via the one or more control signals.

5. The sample and hold circuit of claim 4, wherein the delay elements comprise capacitors.

6. The sample and hold circuit of claim 1, wherein the detection circuit is an analog to digital converter.

7. A high speed sample and hold circuit usable in a system having a clock signal, comprising:
   a plurality of sample and hold subcircuits coupled together in parallel between an input and an output, each such sample and hold subcircuit operable to sample the clock signal during a sample cycle of a sample signal and hold the sampled input signal during a hold cycle of a hold signal, the sample cycles and hold cycles alternating with one another; and
   a calibration subcircuit associated with each of the sample and hold subcircuits, respectively, wherein each calibration subcircuit is operable to synchronize the hold signal associated therewith to the clock signal associated therewith, thereby reducing a timing mismatch between the plurality of sample and hold subcircuits and minimizing a distortion associated therewith, wherein the calibration subcircuit comprises:
      a sample and hold subcircuit output detection circuit operable to determine a timing relationship between the respective hold signal and the respective clock signal;
      a control circuit operably coupled to the detection circuit and operable to generate one or more control signals in response to the determined timing relationship; and
      a delay circuit operably coupled to the control circuit, and operable to delay the respective hold signal in response to the one or more control signals.

8. The sample and hold circuit of claim 7, wherein the detection circuit comprises the output of an analog to digital converter having an input which is coupled to an output of the respective sample and hold subcircuit.

9. The sample and hold circuit of claim 8, wherein the control circuit is further operable to analyze the output of the respective sample and hold subcircuit which represents a state of the input clock signal at an edge of the hold signal, and generate the one or more control signals based thereon.

10. The sample and hold circuit of claim 7, wherein the delay circuit is operable to delay the hold signal for the respective sample and hold subcircuit by capacitively loading a node associated with the hold signal, wherein an amount of capacitive loading is a function of the one or more control signals.

11. A method of reducing timing mismatch in a high speed, parallel coupled sample and hold circuit usable in a system having a clock signal, the high speed, parallel coupled sample and hold circuit including a plurality of sample and hold subcircuits coupled together in parallel between an input and an output, each such sample and hold subcircuit operable to sample the clock signal during a sample cycle of a sample signal and hold the sampled input signal during a hold cycle of a hold signal, the sample cycles and hold cycles alternating with one another, comprising the steps of:
   synchronizing the hold signal to the clock signal by modifying the hold signal for each of a plurality of sample and hold subcircuits within the sample and hold circuit, by
      inputting the clock signal to its respective sample and hold subcircuit,
      analyzing a status of the clock signal at an output of the respective sample and hold subcircuit, and
      changing a delay associated with the hold signal based on the analysis; and
   utilizing the modified hold signals in the sample and hold subcircuits, respectively.

12. The method of claim 11, wherein the status of the clock signal is related to a rising edge of the respective hold signal.

13. The method of claim 12, wherein the respective hold signal is adjusted so that the clock signal is sampled at about a midpoint of its edge.

14. The method of claim 11, wherein changing the delay associated with the hold signal comprises adding delay to the hold signal to be used in the sample and hold subcircuit.

15. The method of claim 11, wherein the step of synchronizing the hold signal to the clock signal for each of the plurality of sample and hold subcircuits occurs during a calibration mode of the sample and hold circuit.

* * * * *